(12) United States Patent
Grinberg et al.

(10) Patent No.: US 8,872,096 B2
(45) Date of Patent: Oct. 28, 2014

(54) METHOD AND APPARATUS FOR DETECTING FAILURES OF A DUAL MATRIX SENSOR ARRAY

(75) Inventors: Anatoly G. Grinberg, Brighton, MA (US); Wayne R. Foster, Tyngsborough, MA (US); Martin Hardegger, Sargans (CH); Derek W. Jones, Gallowway (GB); Simon Eggenberger, Gams (CH); Carl Meinherz, Malans (CH)

(73) Assignees: Rockwell Automation Technologies, Inc., Mayfield Heights, OH (US); Rockwell Automation AG, Aarau (CH)

( * ) Notice: Subject to any disclaimer, the term of this patent is extended or adjusted under 35 U.S.C. 154(b) by 254 days.

(21) Appl. No.: 13/445,538

(22) Filed: Apr. 12, 2012

(65) Prior Publication Data

US 2013/0270422 A1    Oct. 17, 2013

(51) Int. Cl.
*H01L 31/00* (2006.01)

(52) U.S. Cl.
USPC ............... 250/214.1; 250/214 C; 250/208.2; 378/98.12

(58) Field of Classification Search
USPC .............. 250/214.1, 214 R, 208.2, 208.1; 348/294, 297, 302, 303, 304; 378/98.9, 378/98.11, 98.12
See application file for complete search history.

(56) References Cited

U.S. PATENT DOCUMENTS

| | | | |
|---|---|---|---|
| 6,888,572 B1 | 5/2005 | Kozlowski | |
| 2009/0086913 A1 * | 4/2009 | Ohta et al. | 378/98.9 |

* cited by examiner

*Primary Examiner* — Francis M Legasse, Jr.
(74) *Attorney, Agent, or Firm* — Boyle Fredrickson, S.C.

(57) ABSTRACT

The subject matter disclosed herein describes an optical sensor used in a safety system. The sensor includes two pixel matrices on a single substrate. Each of the pixel matrices are arranged in a row and column format, and pixels from one matrix are interspersed with pixels from the other matrix such that alternating pixels in each row and column belong to separate matrices. Two sets of selection logic allow each matrix to be enabled separately. Additional monitoring logic is included to detect shorted pixels and/or shorted selection lines. In addition, the frames generated by each pixel array may be compared to detect variation in performance between arrays.

7 Claims, 3 Drawing Sheets

METHOD AND APPARATUS FOR DETECTING FAILURES OF A DUAL MATRIX SENSOR ARRAY

BACKGROUND OF THE INVENTION

The subject matter disclosed herein relates to an optical sensor used in a safety system and, more specifically, to an optical sensor including a dual array of photosensitive devices providing redundant frames.

An optical sensor includes a receiver that converts light incident to the sensor into an electric signal. The receiver may include a single photosensitive device or an array of pixels, for example charge-coupled devices (CCD), complementary metal-oxide-semiconductor (CMOS) sensors, or time-of-flight (TOF) sensors. Each pixel converts the light incident to that pixel to a separate electrical signal. The optical sensor typically has an opening through which the light passes and may further include a lens or optical filter over the opening to focus the light on the detector. Depending on the application requirements and the configuration of the sensor, the optical sensor is suited for a variety of uses ranging from indicating the presence of a beam of light to repioducing a three dimensional (3D) image of an object.

It is known that optical sensors may, be a component of a safety, system, such as a light curtain or a 3D camera monitoring access to, or operation of an industrial machine or process line. The optical sensor, in cooperation with a corresponding optical source, may be used to protect an operator from a potentially hazardous operating region or condition. For example, the optical source may transmit a light beam in front of the restricted region and the optical sensor detects a person or object entering the region via discontinuous reception of the beam. Alternately, the optical sensor may reproduce an image of an object passing through the emitted light. The light beam or the image may be used to determine whether an undesired object or a person has entered a restricted region and appropriate action, such as shutting down a portion or all of the equipment within the region may result.

It is further known that optical sensors are subject to certain failures. For example, adjacent pixels or selection lines to enable a pixel may become shorted together. Further, pixels may not return to a fully discharged, state during a reset. When the optical sensor is used within a safety system, it is desirable to detect any failures of the sensor such that the safety of an operator is not compromised. Further, it is desirable to promptly detect the failure to prevent unsafe operation for a period of time, for example, until a scheduled maintenance interval.

Thus, it would be desirable to provide an optical sensor that continually monitors its performance without interrupting normal operation of the sensor.

BRIEF DESCRIPTION OF THE INVENTION

The subject matter disclosed herein describes an optical sensor used in a safety system. The sensor includes two pixel matrices on a single substrate. Each of the pixel matrices are arranged in a row and column format, and pixels from one matrix are interspersed with pixels from the other matrix such that alternating pixels in each row and column belong to separate matrices. Two sets of selection logic allow each matrix to be enabled separately. Additional monitoring logic is included to detect shorted pixels and/or shorted selection lines. In addition, the frames generated by each pixel array may be compared to detect variation in performance between arrays.

According to one embodiment of the invention, an optical sensor array includes a substrate configured to receive a plurality of photosensitive devices. A first set of photosensitive devices is arranged on the substrate in a row and column format and configured to generate a first frame. A second set of photosensitive devices is also arranged on the substrate in a row and column format and configured to generate a second frame. The first and second set of photosensitive devices are further arranged on the substrate such that adjacent photosensitive devices in each row and in each column are alternately members of the first and second sets of photosensitive devices.

According to another embodiment of the invention, a method of verifying operation of an optical sensor used in a safety system generates a first frame from a first set of photosensitive devices arranged on a substrate in rows and columns and a second frame from a second set of photosensitive devices arranged on the substrate in rows and columns. The first and second set of photosensitive devices are arranged on the substrate such that adjacent photosensitive devices in each row and in each column are alternately members of the first and second sets of photosensitive devices. The optical sensor also evaluates operation of at least a portion of either the first set or the second set of photosensitive devices.

According to still another embodiment of the invention, an optical sensor for use in safety systems includes a substrate configured to receive a plurality of photosensitive devices. The substrate has a first array of photosensitive devices and a second array of photosensitive devices. Each array is arranged in a plurality of rows and columns on the substrate such that adjacent photosensitive devices in each row and in each column are alternately members of the first and second arrays. The optical sensor also includes a first selection circuit configured to generate a row selection signal and a column selection signal corresponding to each row and column of the first array and a second selection circuit configured to generate a row selection signal and a column selection signal corresponding to each row and column of the second array. A first logic circuit is configured to receive each of the row and column selection signals corresponding to the first array as input signals, and a second logic circuit is configured to receive each of the row and column selection signals corresponding to the second array as input signals.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

Figure 1:
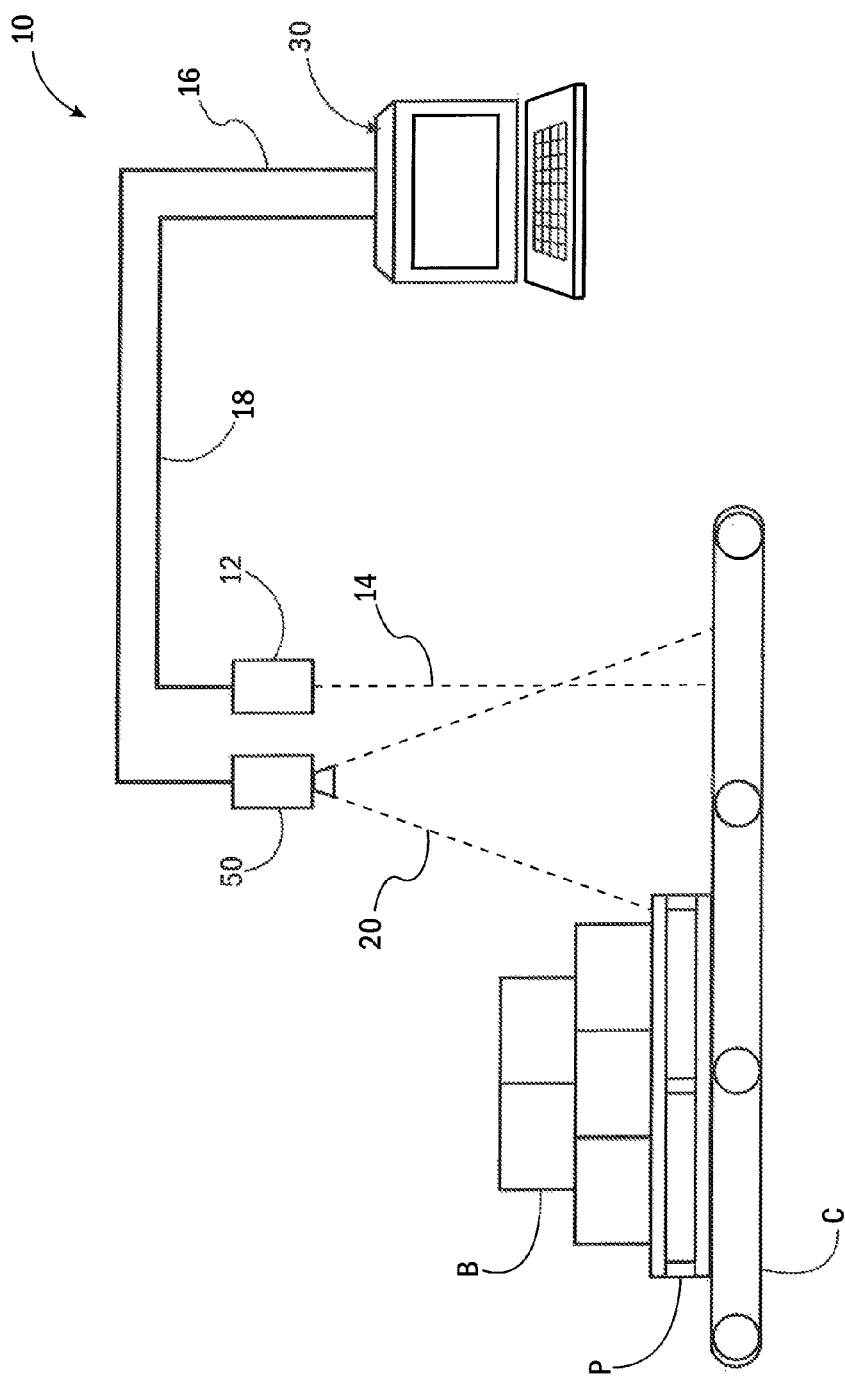
FIG. 1 is a an exemplary environmental view incorporating one embodiment of the present invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They, are not limited to direct connection but include connection through other elements where such connection is recognized as being equivalent by those skilled in the art.

DETAILED DESCRIPTION OF THE PREFERRED EMBODIMENTS

Turning initially to FIG. 1, an optical sensor system 10 is illustrated operating in an exemplary environment. The optical sensor system 10 includes an optical source 12 configured to transmit light in a defined path 14. The optical source 12 may be any suitable source emitting radiation, for example, in the visible or infrared spectrums. The optical source 12 may be, but is not limited to, a light emitting diode, an infrared diode, or a laser diode. Further, the optical source 12 may include one or more light sources and, optionally, may include a lens, a filter, or other optical device to direct, focus, or filter, the light being emitted from the source 12. The defined path 14 is, for example, a beam or a plane of light, which is intended to be transmitted to an optical sensor 50 either directly or by reflection, for example, from an object intersecting the defined path 14.

Figure 2:
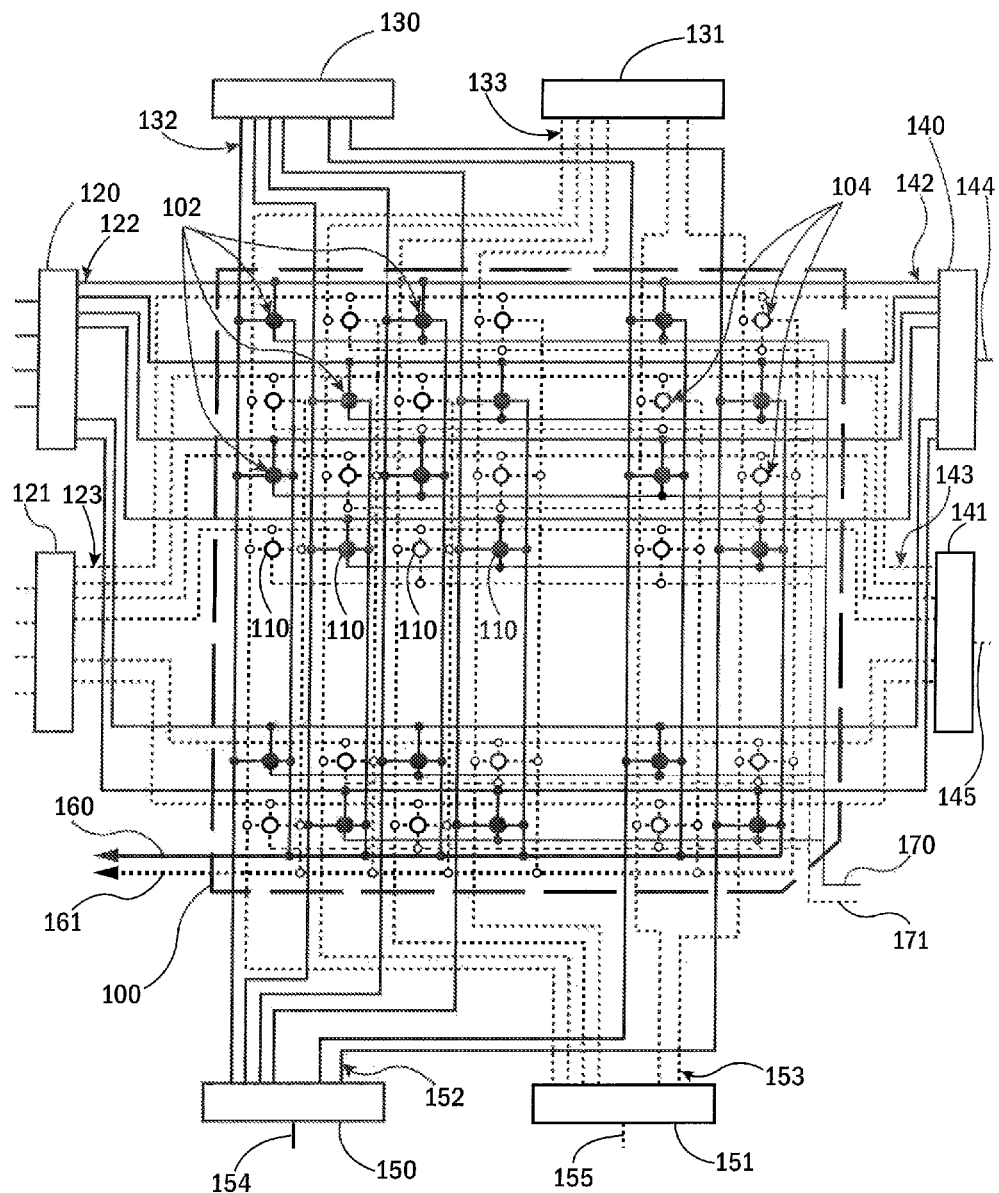
FIG. 2 is a schematic diagram of a dual matrix sensor according to one embodiment of the invention.

As shown in FIG. 1, the optical source 12 may emit a plane of light along a defined path 14. Optionally, multiple beams of light may be directed along the path 14. The path 14 intersects a conveyor, C, and is used to detect the presence, or absence, of an object along the conveyor, C. The conveyor, C, may carry a pallet, P, of boxes, B, between two points. The light emitted from the optical source 12 reflects off the boxes, B, and is detected by the optical sensor 50. The optical sensor 50 converts the light received at the sensor to an electrical signal 16 which is transmitted to a controller 30. The optical sensor 50 is capable of detecting light reflected off objects within its field of view 20. The electrical signal 16 generated by the sensor may be a binary on/off signal indicating the presence or absence of an object within the field of view 20 or, optionally, the electrical signal 16 may be an analog value corresponding to the intensity of light received by the optical sensor 50. Referring also to FIG. 2, the optical sensor 50 may include a dual array of pixels that convert light to electrical signals 16. Thus, the electrical signal 16 may correspond to a signal from a single sensor or from multiple sensors. The controller 30 uses the electrical signal 16 according to the application requirements, for example, to stop the conveyor, C, if an unexpected object is detected within the predefined path 14 or to reconstruct an image of the boxes, B, and pallet, P, passing through the predefined path 14. According to still another embodiment of the invention, at least a portion of the controller 30 may be incorporated into the optical sensor 50 to directly process the electrical signal 16. In addition, the controller 30 may provide a control signal 18 to the optical source 12 to control the light emitted.

According to still other embodiments of the invention, the optical source 12 and the optical sensor 50 may be configured to transmit and receive an optical beam in a defined path 14 configured to cross the path of the conveyor, C, either vertically, horizontally, or at an angle to and displaced above the conveyor, C. The optical sensor 50 may be configured to normally set the electrical signal 16, indicating it is receiving a beam of light from the optical source 12. The electrical signal 16 is reset if an object intersects the defined path 14. The optical source 12 may be a single beam or multiple beams of light, defining, for example, a plane of light. Similarly, the light beams may be arranged vertically, horizontally, or at an angle to and parallel with the conveyor to detect, for example, an operator reaching across the conveyor or into a protected region. The electrical signal 16 may be used by the controller 30 to disable the conveyor, C, or other mechanical device operating within the protected region upon detection of an object entering the protected region.

Figure 4:
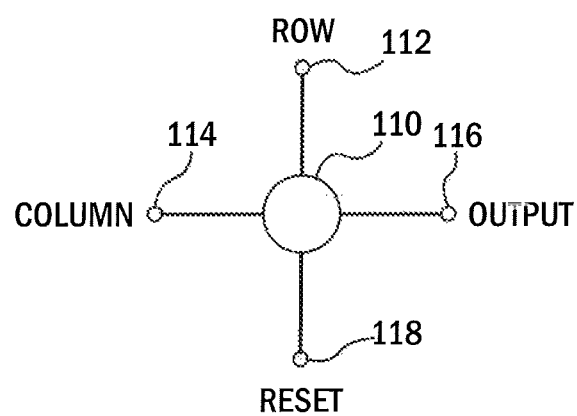
FIG. 4 is a block diagram representation of one embodiment of a pixel used in each matrix of the sensor of FIG. 2.

Referring next to FIG. 2, one embodiment of the optical sensor 50 includes a substrate 100 on which a first array 102 and a second array 104 of photosensitive devices 110 are arranged. Each of the photosensitive devices 110 are arranged in rows and columns for each of the first and second arrays 102, 104. Further, the photosensitive devices 110 are arranged such that adjacent devices 110 in each row and column alternately belong to the first and second arrays 102, 104. Referring also to FIG. 4, each photosensitive device 110 includes a row selection input 112, a column selection input 114, a reset input 118, and an output signal 116. Each input signal, 112, 114 and 118, may be configured to receive a voltage corresponding to a logical zero or one, thereby turning the input either off or on. The output signal 116 may similarly be configured to output a voltage corresponding to a logical zero or one, indicating the presence or absence of light at the photosensitive device 110. Optionally, the output signal 116 may be configured to output a voltage of variable amplitude corresponding to the intensity of light present at the photosensitive device 110. It is further contemplated that still other configurations of the photosensitive device 110 may be used without deviating from the scope of the invention.

As further illustrated in FIG. 2, each of the first and second arrays 102, 104 includes selection circuits to selectively enable each of the photosensitive devices 110 within the corresponding array. According to one embodiment, the selection circuit for the first array 102 includes a row selection circuit 120 and a column selection circuit 130. Similarly, the selection circuit for the second array 104 includes a row selection circuit 121 and a column selection circuit 131. Each of the selection circuits 120, 121, 130, 131 includes multiple selection lines 122, 123, 132, 133. Each selection line 122, 123, 132, 133 is connected to each of the photosensitive devices 110 in the corresponding row or column of the corresponding array 102, 104.

Each selection line 122, 123, 132, 133 is also provided as an input 142, 143, 152, 153 to a logic, circuit 140, 141, 150, 151. As illustrated, each array 102, 104 includes a first logic circuit 140, 141 to monitor the row selection lines 122, 123 and a second logic circuit 150, 151 to monitor the column selection lines 132, 133. Each of the row logic circuits 140, 141 and column logic circuits 150, 151 monitor the respective selection lines 122, 123, 132, 133 and provide an output 144, 145, 154, 155 indicating that a selection line for that array 102, 104 is active.

Figure 3:
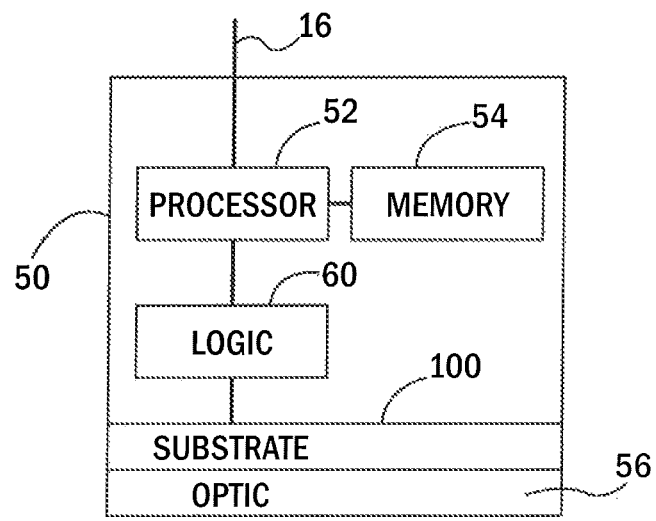
FIG. 3 is a block diagram representation of an optical sensor incorporating the present invention.

Referring next to FIG. 3, a block diagram of an exemplary embodiment of an optical sensor 50 is illustrated. The optical sensor 50 includes the substrate 100 on which the photosensitive devices 110 are mounted. Each of the selection circuits 120, 121, 130, 131 and logic circuits 140, 141, 150, 151 are represented by the logic block 60. The logic block 60 is further in communication with a processor 52, which, in turn is in communication with memory 54. The processor 52 may be configured to execute instructions stored in memory 54 or to read and write data to the memory 54. The signal line 16 is connected between the processor 52 and the controller 30. It is contemplated that numerous configuration and/or divisions of these blocks may be implemented without deviating from the scope of the invention. For example, the selection circuits 120, 121, 130, 131 and logic circuits 140, 141, 150, 151 may be incorporated into a field programmable gate array (FPGA), an application specific integrated circuit (ASIC), discrete logic devices, or even implemented in digital logic on the processor 52. The processor 52 and memory 54 may be single devices or multiple devices operatively connected as is understood in the art. Further, the processor 52 and memory 54 may be incorporated in part or in whole with an FPGA or ASIC implementing the logic 60. Still other embodiments of the invention may utilize any combination of the aforementioned devices. An optional optic device 56 such as a lens or filter may be, mounted over the substrate 100 to focus and/or filter the incoming light.

In operation, the dual array sensor system 10 facilitates detection of failures in the sensor 50 without interrupting operation of the sensor 50. During normal operation, each of the first and second set 102, 104 of photosensitive devices 110 is read on a repeated, periodic basis for continual monitoring of light from the optical source 12. During one periodic cycle, each of the photosensitive devices 110 in each of the first and second arrays 102, 104 are enabled and the corresponding output signal 116 read. The reset signal 118 is then supplied to each photosensitive device 110 to return the device to a neutral or uncharged state. Operation of each device may be tested and the cycle repeated.

According to an exemplary periodic cycle, the first set 102 of photosensitive devices 110 is read first. The selection circuits 120, 130 sequentially enable each of the photosensitive devices 110 in the first array 102. For example, row selection circuit 120 enables the row 1 selection line 122 and the column selection circuit 130 enables the column 1 selection line 132. When both row and selection inputs, 112 and 114, for a photosensitive device 110 are enabled, the respective device 110 will provide a voltage at the output signal 116 corresponding to the light it has received. The voltage may be either a fixed level, indicative of a logical one or zero and corresponding to an on or an off signal, or the voltage may be a variable level corresponding to the intensity of light received by the device 110 since the last time the device was reset. While one of the row or column selection circuits, 120 or 130, maintains the current selection line, 122 or 132 respectively, enabled, the other of the selection circuits, 120 or 130, sequentially increments the row or column to be enabled. The output signal 116 from each of the photosensitive devices 110 is electrically connected to a first, output signal 160 for the first array 102 that is read, for example, by the processor 52 or by another portion of the logic 60 to determine the status of each photosensitive device 110 as it is enabled. Thus, the output signal 116 for each column in the first row or each row in the first column is sequentially enabled. The sequence is then repeated along each row or column until each of the devices 110 in the first array 102 has been enabled and the corresponding output signal 116 been read.

As each photosensitive device 110 is enabled, its output signal 116 is used to generate a first frame corresponding to the first array 102. The output signal 116 is read, for example, by the processor 52. The processor 52, or other logic 60, receives the first output signal 160 and the selection lines 122, 132 of the first array 102. The value of each output signal 116 may be stored in memory 54 along with its corresponding location within the first array 102. Thus, the entire image of the first array 102 may be reconstructed as a first frame. The frame may be compared to known images to determine whether an object belongs within a restricted area. Optionally, the frame may be used to detect the presence of any object entering a restricted area.

After reading the first set 102 of photosensitive devices 110, the second set 104 of photosensitive devices 110 is then read. The selection circuits 121, 131 sequentially enable each of the photosensitive devices 110 in the second array 104. For example, row selection circuit 121 enables the row 1 selection line 123 and the column selection circuit 131 enables the column 1 selection line 133. While one of the row or column selection circuits, 121 or 131, maintains the current selection line, 123 or 133 respectively, enabled, the other of the selection circuits, 121 or 131, sequentially increments the row or column to be enabled. The output signal 116 from each of the photosensitive devices 110 is electrically connected to a second output signal 161 for the second array 104 that is read, for example, by the processor 52 or by another portion of the logic 60 to determine the status of each photosensitive device 110 as it is enabled. The sequence is then repeated along each row or column until each of the devices 110 in the second array 104 has been enabled and the corresponding output signal 116 been read.

As each photosensitive device 110 is enabled, its output signal 116 is used to generate a second frame corresponding to the second array 104. The output signal 116 is read, for example, by the processor 52. The processor 52, or other logic 60, receives the second output signal 161 and the selection lines 123, 133 of the second array 104. The value of each output signal 116 may be stored in memory 54 along with its corresponding location within the second array 104. Thus, the entire image of the second array 104 may be reconstructed as a second frame. The frame may be compared to known images to determine whether an object belongs within a restricted area. Optionally, the frame may be used to detect the presence of any object entering a restricted area.

After reading each of the photosensitive devices 110, they are reset in preparation for the next periodic cycle. A first reset signal 170 is supplied to the first array 102 and a second reset signal 171 is supplied to the second array 104. The first reset signal 170 is electrically connected to the reset signal 118 for each device 110 in the first array 102. Similarly, the second reset signal 171 is electrically connected to the reset signal 118 for each device 110 in the second array 104. Application of the reset signal 170, 171 returns each of the photosensitive devices 110 in the respective array 102, 104 to an off, or neutral, state. Removal of the reset signal 170, 171 allows the photosensitive device 110 to again begin converting light energy incident on the devices 110 in the respective array 102, 104 to electrical energy.

In a safety system, the sensor system 10 may be used, for example, to detect unauthorized entry of a person or object into a restricted area or to detect the presence of a work-piece or part being transferred into a work zone. According to one embodiment of the invention, the optical source 12 may be one or more light beams establishing a light curtain, and each of the light beams is received by one or more optical sensor units 50. According to another embodiment of the invention, the optical source 12 may generate a plane of light and the optical sensor unit 50 may be a 3-D camera that generates images of the objects from which the light is reflected. The type of optical source 12 and sensor unit 50 is selected according to the application requirements.

Regardless of the type of optical source 12 and sensor unit 50 selected, the alternating pixel configuration of the first and second arrays 102, 104 permit testing of the optical sensor system 10 without interrupting the normal monitoring function of the system 10. As each photosensitive device 110 is enabled, one of the row selection lines 122, 123, and one of the column selection lines 132, 133 is enabled. The corresponding row and column logic circuits, 140, 141, 150, 151 receive the selection lines as inputs 142, 143, 152, 153. If one of the inputs 142, 143, 152, 153 indicates the selection line is enabled, the logic circuit 140, 141, 150, 151 sets its corresponding output signal 144, 145, 154, 155. The outputs 144, 145 for each of the row logic circuits 140, 141 may then be provided as an input to a first comparator circuit and the outputs 154, 155 for each of the column logic circuits 150, 151 may be provided as an input to a second comparator circuit. Because the first array 102 and the second array 104 are read sequentially, if both outputs 144, 145 are enabled in tandem, a short circuit exists between a row selection line 122 of the first array 102 and a row selection line 123 of the second array 104. Similarly, if both outputs 154, 155 are enabled in tandem, a short circuit exists between a column selection line 132 of the first array 102 and a column selection line 133 of the second array 104. The output of each comparator circuit may be used to set a warning or fault message or to provide an audio or visual indication of the fault condition to an operator. It is contemplated that the comparator circuit may be an analog circuit, for example an operation amplifier, or implemented within a digital circuit, for example, the processor 52 without deviating from the scope of the invention. Thus, the row and column logic circuits, 140, 141, 150, 151 provide continual monitoring for a short between selection lines within the sensor unit 50.

The dual matrix array configuration also allows monitoring adjacent pixels for a short circuit condition. As each photosensitive device 110 is enabled, it should be providing the only output signal 116 from either array 102, 104. If adjacent photosensitive devices 110 in a row or column become shorted together, when one of the photosensitive devices 110 is enabled, both photosensitive devices 110 provide an output signal 116. Because each of the output signals 116 for the photosensitive devices 110 in the first array 102 are electrically connected to the output signal 160 and each of the output signals 116 for the photosensitive devices 110 in the second array 104 are electrically connected to the output signal 161, the two output signals 160, 161 are provided as inputs to a comparator circuit. The output of the comparator circuit may be used to set a warning or fault message or to provide an audio or visual indication of the fault condition to an operator. It is contemplated that the comparator circuit may be an analog circuit, for example an operation amplifier, or implemented within a digital circuit, for example, the processor 52 without deviating from the scope of the invention. Thus, the interlaced configuration of photosensitive devices 110 provide continual monitoring for a short between adjacent pixels in each of the arrays 102, 104.

Either during a normal reset sequence or as a separate event, the sensor unit may also test operation of the photosensitive devices 110. During operation, the photosensitive device 110 converts incident light to an electrical signal indicating the presence of light. Application of the reset signal 170, 171 returns the photosensitive device 110 to an off or neutral state. However, performance of the photosensitive devices 110 may degrade over time and each photosensitive device 110 may not return completely, or at all, to an off or neutral state, thereby providing an incorrect indication of the amount of light incident on the sensor 50. Correct operation of the photosensitive devices 110 may be tested by providing a reset signal 170, 171 to the corresponding array 102, 104. With a reset signal 118 present, the output 116 of a photosensitive device 110 should be at its neutral state. Therefore, while the reset signal 170, 171 is active, the selection lines 122, 123, 132, 133, may be enabled. The presence of an output signal 160, 161 indicates that at least one of the photosensitive devices 110 is no longer returning to the neutral state. The selection lines 122, 123, 132, 133, may either enable photosensitive devices 110 sequentially to identify a specific failure or all of the devices 110 in tandem to generally detect a failure within one of the arrays 102, 104.

It is further contemplated that each of the first and second frames reconstructed from the first and second arrays 102 and 104, respectively, may be provided as input to a comparator circuit. The comparator circuit may compare a portion of or the entire frame from each of the first and second arrays 102, 104 to each other. Due to their proximity to each other, adjacent photosensitive devices 110 receive substantially equivalent amounts of light. A comparison of a portion or all of the first and second frames can determine whether the frames are, therefore, substantially the same. A configurable setpoint may be used to define the acceptable variation of output signals 116 between adjacent photosensitive devices 110.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention

We claim:

1. An optical sensor array, comprising:
    a first set of photosensitive devices arranged in a row and column format and configured to generate a first frame;
    a second set of photosensitive devices arranged in a row and column format and configured to generate a second frame, wherein the first and second set of photosensitive devices are arranged such that adjacent photosensitive devices in each row and in each column are alternately members of the first and second sets of photosensitive devices;
    a first output signal electrically connected to and configured to conduct an output from the first set of photosensitive devices;
    a second output signal electrically connected to and configured to conduct an output from the second set of photosensitive devices; and
    a comparator configured to receive each of the first and the second output signals as an input signal to the comparator, the comparator generating an output signal if both of the comparator input signals indicate at least one of the photosensitive devices from each set is enabled in tandem.

2. The optical sensor array of claim 1 further comprising:
    a first reset signal electrically connected to each of the photosensitive devices in the first set;
    a second reset signal electrically connected to each of the photosensitive devices in the second set; and an evaluation circuit to monitor the state of the first output signal when the first reset signal is enabled and to monitor the state of the second output signal when the second reset signal is enabled.

3. The optical sensor array of claim 1 further comprising a comparator configured to receive each of the first frame and the second frame as inputs, the comparator generating a signal if at least a portion of the first frame does not match a corresponding portion of the second frame.

4. An optical sensor array, comprising:
- a first set of photosensitive devices arranged in a row and column format and configured to generate a first frame;
- a second set of photosensitive devices arranged in a row and column format and configured to generate a second frame, wherein the first and second set of photosensitive devices are arranged such that adjacent photosensitive devices in each row and in each column are alternately members of the first and second sets of photosensitive devices;
- a first selection circuit configured to enable each of the photosensitive devices in the first set;
- a second selection circuit configured to enable each of the photosensitive devices in the second set; and
- a comparator configured to generate an output signal when one of the selection circuits is enabling photosensitive devices in both the first set and the second set in tandem.

5. An optical sensor for use in safety systems, comprising:
- a first array of photosensitive devices arranged in a plurality of rows and columns;
- a second array of photosensitive devices arranged in a plurality of rows and columns, wherein the first and second arrays are arranged such that adjacent photosensitive devices in each row and in each column are alternately members of the first and second arrays;
- a first selection circuit configured to generate a row selection signal and a column selection signal corresponding to each row and column of the first array;
- a second selection circuit configured to generate a row selection signal and a column selection signal corresponding to each row and column of the second array;
- a first logic circuit configured to receive as input signals each of the row and column selection signals corresponding to the first array and to generate an output signal if any of the input signals are enabled;
- a second logic circuit configured to receive as input signals each of the row and column selection signals corresponding to the second array and to generate an output signal if any of the input signals are enabled; and
- a comparator circuit configured to receive each of the output signals from the first and second logic circuits as input signals and configured to generate an output signal if both comparator input signals are enabled in tandem.

6. An optical sensor for use in safety systems, comprising:
- a first array of photosensitive devices arranged in a plurality of rows and columns;
- a second array of photosensitive devices arranged in a plurality of rows and columns, wherein the first and second arrays are arranged such that adjacent photosensitive devices in each row and in each column are alternately members of the first and second arrays;
- a first output signal electrically connected to each output signal of the photosensitive devices in the first array;
- a second output signal electrically connected to each output signal of the photosensitive devices in the second array; and
- a comparator circuit receiving each of the first and second output signals as an input signal and generating and output signal if both of the comparator circuit input signals indicate at least one of the photosensitive devices from each array is enabled in tandem.

7. The optical sensor of claim 6 wherein each photosensitive device is configured to receive a reset signal to return the photosensitive device to a neutral state, the optical sensor further comprising:
- a first reset signal electrically connected to each of the reset signals of the photosensitive devices of the first array;
- a second reset signal electrically connected to each of the reset signals of the photosensitive devices of the second array; and
- an evaluation circuit to monitor the state of the first output signal when the first reset signal is enabled and to monitor the state of the second output signal when the second reset signal is enabled.

* * * * *